(12) United States Patent
Aitken et al.

(10) Patent No.: US 9,659,651 B1
(45) Date of Patent: May 23, 2017

(54) QUANTUM MEMORY SYSTEMS AND QUANTUM REPEATER SYSTEMS COMPRISING CHALCOGENIDE OPTICAL FIBER LINKS AND METHODS OF STORING AND RELEASING PHOTONS USING THE SAME

(71) Applicant: Corning Incorporated, Corning, NY (US)

(72) Inventors: Bruce Gardiner Aitken, Corning, NY (US); Stuart Gray, Corning, NY (US); Daniel Aloysius Nolan, Corning, NY (US); Ji Wang, Painted Post, NY (US); Jun Yang, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/203,292

(22) Filed: Jul. 6, 2016

Related U.S. Application Data

(60) Provisional application No. 62/298,706, filed on Feb. 23, 2016.

(51) Int. Cl.
*G11C 13/06* (2006.01)
*H01S 3/16* (2006.01)
(Continued)

(52) U.S. Cl.
CPC .......... *G11C 13/06* (2013.01); *G11C 13/0004* (2013.01); *H01S 3/04* (2013.01);
(Continued)

(58) Field of Classification Search
CPC . G11C 13/06; G11C 13/0004; G11C 2213/30; H01S 3/1603; H01S 3/094003; H01S 3/06716; H01S 3/04
See application file for complete search history.

(56) References Cited

U.S. PATENT DOCUMENTS 5,239,548 A * 8/1993 Babbitt .................... G03H 1/00
359/561
5,771,117 A * 6/1998 Harris ...................... G02F 1/353
359/326

(Continued)

OTHER PUBLICATIONS

Kimble; "The Quantum Internet"; Nature vol. 453 (Jun. 19, 2008); pp. 1023-1030.

(Continued)

*Primary Examiner* — Vanthu Nguyen
(74) *Attorney, Agent, or Firm* — Russell S. Magaziner (57) ABSTRACT

A quantum memory system includes a chalcogenide optical fiber link, a magnetic field generation unit and a pump laser. The chalcogenide optical fiber link includes a photon receiving end opposite a photon output end and is positioned within a magnetic field of the magnetic field generation unit when the magnetic field generation unit generates the magnetic field. The pump laser is optically coupled to the photon receiving end of the chalcogenide optical fiber link. The chalcogenide optical fiber link includes a core doped with a rare-earth element dopant. The rare-earth element dopant is configured to absorb a storage photon traversing the chalcogenide optical fiber link upon receipt of a first pump pulse output by the pump laser. Further, the rare-earth element dopant is configured to release the storage photon upon receipt of a second pump pulse output by the pump laser.

18 Claims, 4 Drawing Sheets

(51) Int. Cl.
*H01S 3/094* (2006.01)
*H01S 3/04* (2006.01)
*H01S 3/067* (2006.01)
*G11C 13/00* (2006.01)

(52) U.S. Cl.
CPC .... *H01S 3/06716* (2013.01); *H01S 3/094003* (2013.01); *H01S 3/1603* (2013.01); *G11C 2213/30* (2013.01)

(56) References Cited

U.S. PATENT DOCUMENTS

| | | | | |
|---|---|---|---|---|
| 6,097,532 | A * | 8/2000 | Harris | G02F 1/3515 359/326 |
| 6,678,450 | B1 * | 1/2004 | Franson | B82Y 10/00 359/326 |
| 8,094,367 | B2 * | 1/2012 | Ham | G02F 1/3515 359/326 |
| 9,313,180 | B1 | 4/2016 | Gray et al. | |
| 2008/0258049 | A1 * | 10/2008 | Kuzmich | B82Y 10/00 250/214.1 |

OTHER PUBLICATIONS

Hughes de Riedmatten; "Optical Quantum Memories" presentation; ICFO and ICREA; Jun. 25, 2008.

Thiel et al.; "Rare-earth-doped materials for applications in quantum information storage and signal processing"; Journal of Luminescence 131 (2011); pp. 353-361.

Di Bartolo; Optical Interactions in Solids, Second Edition; Copyright 2010 by World Scientific Publishing Co. Pte. Ltd.; pp. 385-402.

Economou; The Physics of Solids, Essentials and Beyond; Copyright 2010 Springer-Verlag Verlin Heidelberg; pp. 97-99.

Choi et al.; "Crossrelaxations between and multiphonon relaxation of near-infrared excited states of Pr3+ ions in selenide glasses"; Chemical Physics Letters 368 (2003); pp. 625-629.

Sun et al.; "Exceptionally narrow homogeneous linewidth in erbium-doped glasses"; Optics Letters vol. 31, No. 23 (Dec. 1, 2006); pp. 3453-3455.

Gu et al.; "Photoluminescence and Excitation Spectroscopy in Er:As2S3 Glass"; Lasers and Electro-Optics Society Annual Meeting, 1993. LEOS '93 Conference Proceedings. IEEE (Nov. 15-18, 1993); pp. 206-207.

Sangouard et al.; "Quantum repeaters based on atomic ensembles and linear optics"; Review of Modern Physics, vol. 83 (Jan.-Mar. 2011); pp. 33-80.

Hastings-Simon et al.; "Controlled Stark shifts in Er3+-doped crystalline and amorphous waveguides for quantum state storage"; Optics Communications 266 (2006); pp. 716-719.

Huang et al.; "Stark levels analysis for Er3+-doped oxide glasses: germanate and silicate"; Optical Materials 15 (2001); pp. 243-260.

* cited by examiner

QUANTUM MEMORY SYSTEMS AND QUANTUM REPEATER SYSTEMS COMPRISING CHALCOGENIDE OPTICAL FIBER LINKS AND METHODS OF STORING AND RELEASING PHOTONS USING THE SAME

This application claims the benefit of priority under 35 U.S.C. §119 of U.S. Provisional Application Ser. No. 62/298,706, filed on Feb. 23, 2016, the content of which is relied upon and incorporated herein by reference in its entirety.

BACKGROUND

The present disclosure relates to vacuum assisted quantum memory systems and quantum repeater systems. More specifically, the present disclosure introduces technology for quantum memory systems and quantum repeater systems having a chalcogenide optical fiber link.

BRIEF SUMMARY

According to the subject matter of the present disclosure, a quantum memory system includes a chalcogenide optical fiber link, a magnetic field generation unit and a pump laser. The chalcogenide optical fiber link includes a photon receiving end opposite a photon output end. The chalcogenide optical fiber link is positioned within a magnetic field of the magnetic field generation unit when the magnetic field generation unit generates the magnetic field. The pump laser is optically coupled to the photon receiving end of the chalcogenide optical fiber link. The chalcogenide optical fiber link includes a core doped with a rare-earth element dopant. The rare-earth element dopant is configured to absorb a storage photon traversing the chalcogenide optical fiber link when (i) the storage photon transfers an electron of the rare-earth element dopant from a first split ground state to an excited energy state and (ii), upon receipt of a first pump pulse output by the pump laser, the first pump pulse transfers the electron of the of the rare-earth element dopant from the excited energy state into a second split ground state. Further, the rare-earth element dopant is configured to release the storage photon when (i) the electron of the of the rare-earth element dopant is transferred from the second split ground state to the excited energy state, upon receipt of a second pump pulse output by the pump laser and (ii) the electron of the rare-earth element dopant decays from the excited energy state to the first split ground state such that the storage photon exits the photon output end of the chalcogenide optical fiber link.

In accordance with one embodiment of the present disclosure, a quantum repeater system includes two chalcogenide optical fiber links, one or more magnetic field generation units, one or more pump lasers, and entanglement optics. Each chalcogenide optical fiber link includes a photon receiving end opposite a photon output end. Each chalcogenide optical fiber link is positioned within a magnetic field of the one or more magnetic field generation units when the one or more magnetic field generation units generate the magnetic field. At least one of the one or more pump lasers are optically coupled to the photon receiving end of each chalcogenide optical fiber link. Each chalcogenide optical fiber link includes a core doped with a rare-earth element dopant. The rare-earth element dopant is configured to absorb a storage photon traversing the chalcogenide optical fiber link when (i) the storage photon transfers an electron of the rare-earth element dopant from a first split ground state to an excited energy state and (ii), upon receipt of a first pump pulse output by the one or more pump lasers, the first pump pulse transfers the electron of the of the rare-earth element dopant from the excited energy state into a second split ground state. Further, the rare-earth element dopant is configured to release the storage photon when (i) the electron of the of the rare-earth element dopant is transferred from the second split ground state to the excited energy state, upon receipt of a second pump pulse output by the one or more pump lasers and (ii) the electron of the rare-earth element dopant decays from the excited energy state to the first split ground state such that the storage photon exits the photon output end of the chalcogenide optical fiber link. Moreover, the entanglement optics include two entangling pathways optically coupled to the photon output end of each chalcogenide optical fiber link a beamsplitter positioned such that each entangling pathway traverses the beamsplitter.

In accordance with another embodiment of the present disclosure, an entangled photon generator includes a first quantum repeater system, a second quantum repeater system, entanglement optics, a pathway splitter, and an entanglement detector. The first quantum repeater system and the second quantum repeater system each include two chalcogenide optical fiber links. The first quantum repeater system and the second quantum repeater system are each structurally configured to generate two entangled pairs of photons. Further, the entanglement optics include a first entangling pathway optically coupled to and extending between the first quantum repeater system and the entanglement detector and a second entangling pathway optically coupled to and extending between the second quantum repeater system and the pathway splitter.

In accordance with another embodiment of the present disclosure, a method of absorbing and releasing a storage photon in a quantum memory system includes generating a magnetic field using a magnetic field generation unit and emitting a storage photon from a storage photon generator optically coupled to a photon receiving end of a chalcogenide optical fiber link. The chalcogenide optical fiber link includes a photon output end opposite the photon receiving end. The chalcogenide optical fiber link is positioned within the magnetic field generated by the magnetic field generation unit. The chalcogenide optical fiber link includes a core doped with a rare-earth element dopant and upon receipt of the storage photon by the chalcogenide optical fiber link, the storage photon is absorbed within the core doped with the rare-earth element dopant by transferring an electron of the rare-earth element dopant from a first split ground state to an excited energy state. The method also includes emitting a first pump pulse from a pump laser optically coupled to the photon receiving end of the chalcogenide optical fiber link such that the first pump pulse transfers the electron of the rare-earth element dopant from the excited energy state to a second split ground state, upon receipt of the first pump pulse by the chalcogenide optical fiber link, to store the storage photon within the core doped with the rare-earth element dopant. The method further includes emitting a second pump pulse from the pump laser such that (i) the second pump pulse transfers the electron of the rare-earth element dopant from the second split ground state to the excited energy state, upon receipt of the first pump pulse by the chalcogenide optical fiber link, and (ii) the electron of the rare-earth element dopant decays from the excited energy state to the first split ground state such that the storage photon exits the photon output end of the chalcogenide optical fiber link.

In accordance with another embodiment of the present disclosure, a quantum memory system includes a chalcogenide optical fiber link, a magnetic field generation unit and a pump laser. The chalcogenide optical fiber link includes a photon receiving end opposite a photon output end. The chalcogenide optical fiber link is positioned within a magnetic field of the magnetic field generation unit when the magnetic field generation unit generates the magnetic field. The pump laser is optically coupled to the photon receiving end of the chalcogenide optical fiber link. Further, the chalcogenide optical fiber link includes a core doped with a rare-earth element dopant configured to store a storage photon for a photon storage lifetime comprising between about 1 ns and about 1 µs.

In accordance with yet another embodiment of the present disclosure, a quantum memory system comprising a chalcogenide optical fiber link, a magnetic field generation unit and a pump laser. The chalcogenide optical fiber link includes a photon receiving end opposite a photon output end. The chalcogenide optical fiber link is positioned within a magnetic field of the magnetic field generation unit when the magnetic field generation unit generates the magnetic field. The pump laser is optically coupled to the photon receiving end of the chalcogenide optical fiber link. Further, the chalcogenide optical fiber link comprises a core doped with a rare-earth element dopant configured to absorb about 50% or more of a plurality of storage photons traversing the chalcogenide optical fiber link.

Although the concepts of the present disclosure are described herein with primary reference to some specific vacuum assisted wound closure assembly configurations, it is contemplated that the concepts will enjoy applicability to quantum memory systems and quantum repeater systems having any configuration.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
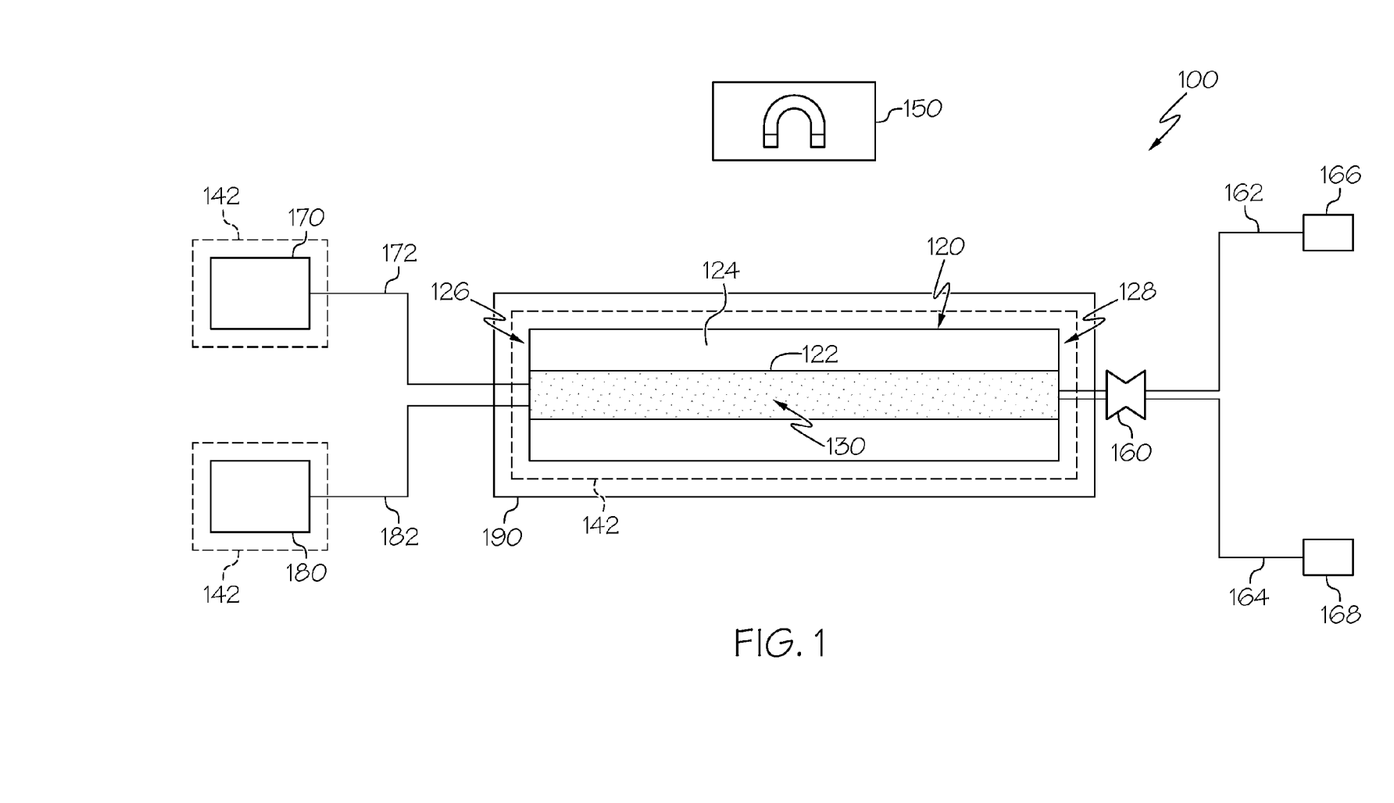
FIG. 1 is a schematic illustration of a quantum memory system having a chalcogenide optical fiber link with a rare-earth element dopant, according to one or more embodiments shown and described herein.
Figure 3:
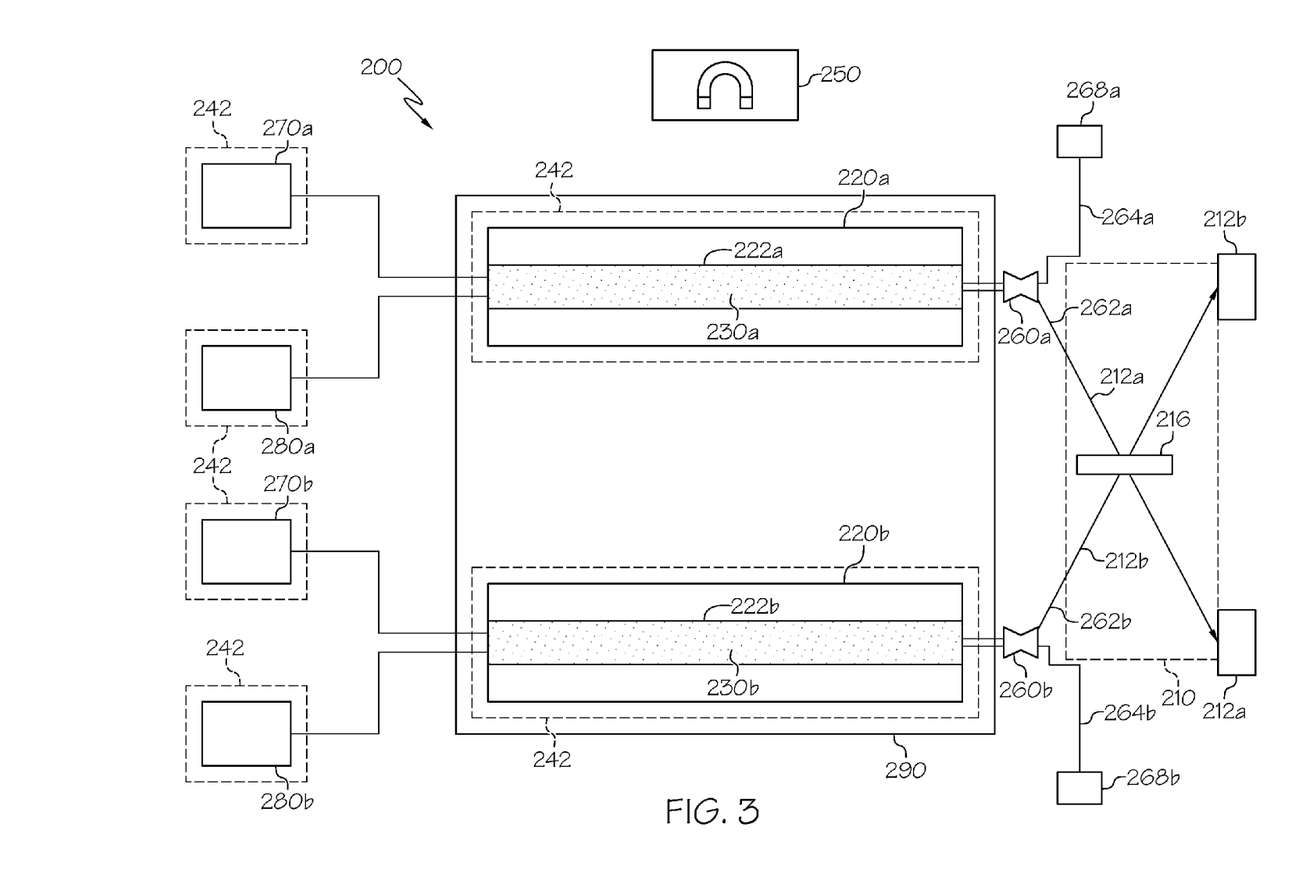
FIG. 3 is a schematic illustration of a quantum repeater system having multiple chalcogenide optical fiber link with a rare-earth element dopant, as depicted in FIG. 1, according to one or more embodiments shown and described herein.

FIG. 1 is a schematic illustration of quantum memory system 100. The quantum memory system 100 comprises a chalcogenide optical fiber link 120, a magnetic field generation unit 150, a storage photon generator 170, and a pump laser 180. As described below, the quantum memory system 100 is structurally configured to store and release one or more storage photons, for example, on demand, such that the quantum memory system 100 may be synchronized with one or more additional quantum memory systems to form a quantum repeater system 200, for example, as depicted in FIG. 3. Further, the quantum repeater system 200 of FIG. 3 may be may be structurally configured to entangle a pair of storage photons that are each stored and released by respective quantum memory systems. Moreover, the quantum memory system 100 and the quantum repeater system 200 described herein may be incorporated into one or more quantum communications systems, for example, quantum key generation systems, quantum telecommunications systems, quantum internet systems, and any other current or yet-to be developed quantum communications systems.

As depicted in FIG. 1, the chalcogenide optical fiber link 120 of the quantum memory system 100 includes a core 122 doped with a rare-earth element dopant 130 and a photon receiving end 126 opposite a photon output end 128. The chalcogenide optical fiber link 120 also includes a cladding layer 124 surrounding the core 122. The chalcogenide optical fiber link 120 may comprise a diameter of between about 75 µm and about 200 µm, such as about 100 µm, 125 µm, 150 µm, 175 µm, or the like, as defined by the required optical depth of the chalcogenide optical fiber link 120. The chalcogenide optical fiber link 120 may also comprise a length of between about 0.25 m and about 10 m, for example, about 0.5 m, 1 m, 2.5 m, 5 m, 7.5 m, or the like, as defined by the required optical depth of the chalcogenide optical fiber link 120. Further, the chalcogenide optical fiber link 120 comprises glass that includes a chalcogen material, such as sulfur, selenium, tellurium, or combinations thereof.

The rare-earth element dopant 130 doped into the core 122 of the chalcogenide optical fiber link 120 includes one or more rare-earth elements, for example, one or more lanthanide elements, including erbium, thulium, and praseodymium, as well non-lanthanide elements such as scandium and yttrium. Further, the rare-earth element dopant 130 may comprises between about 0.01% and about 2% of the total molecular weight of the chalcogenide optical fiber link 120, for example, 0.025%, 0.05%, 0.075%, 0.1%, 0.125%, 0.25%, 0.5%, 0.75%, 1.0%, 1.25%, 1.5%, 1.75%, or the like. The rare-earth element dopant 130 doped into the core 122 the chalcogenide optical fiber link 120 also includes a plurality of electrons, each comprising a plurality of energy states. Further, the plurality of electrons are transferable between energy states, for example, when the core 122 of the chalcogenide optical fiber link 120 receives one or more storage photons emitted by the storage photon generator 170 and/or one or more pump pulses emitted by the pump laser 180, as described in more detail below.

The storage photon generator 170 is optically coupled to the photon receiving end 126 of the chalcogenide optical fiber link 120 and is structurally configured to generate and emit a storage photon, for example, an entangled storage photon or a non-entangled storage photon. The storage photon generator 170 comprises a photon source, for example a laser, a laser optically coupled to a non-linear crystal, a parametric down convertor, or the like. Further, the storage photon generator 170 may generate and emit storage photons using a four-wave mixing process, or any method or process of generating photons.

In operation, the storage photon generator 170 may generate and emit storage photons having any wavelength, for example, between about 500 nm and about 2200 nm, for example about 1550 nm. As a non-limiting example, the storage photon emitted by the storage photon generator 170 may comprise a first entangled storage photon that is entangled with a second entangled storage photon simultaneously emitted by the storage photon generator 170. In operation, the first entangled storage photon may traverse the chalcogenide optical fiber link 120 and the second entangled storage photon may travel along a pathway separate from the chalcogenide optical fiber link 120 while remaining entangled with the first entangled storage photon.

Referring still to FIG. 1, the storage photon generator 170 may be optically coupled to the chalcogenide optical fiber link 120 using a storage photon transmission fiber 172 or other waveguide device, which may extend between the storage photon generator 170 and the photon receiving end 126 of the chalcogenide optical fiber link 120. Further, the storage photon generator 170 may be optically coupled to the photon receiving end 126 of the chalcogenide optical fiber link 120 by aligning the storage photon generator 170 with the photon receiving end 126, for example, using one or more alignment mechanisms 142 structurally configured to optically align the storage photon generator 170 with the core 122 of the chalcogenide optical fiber link 120. The one or more alignment mechanisms 142 may comprise an alignment stage, an optical switch, or both. Further, the storage photon generator 170 and/or the chalcogenide optical fiber link 120 may be coupled to individual alignment mechanisms 142.

The pump laser 180 is optically coupled to the photon receiving end 126 of the chalcogenide optical fiber link 120 and is structurally configured to generate and emit pump pulses. The pump laser 180 may comprise any laser source, for example, a diode laser, an external cavity diode laser, a fiber laser, a dye laser, or the like. Further, the pump laser 180 may be structurally configured to emit pump pulses having any wavelength, for example, between about 500 nm and about 2200 nm. Moreover, the wavelength of the pump pulses generated and emitted by the pump laser 180 may be larger than the wavelength of the storage photons generated and emitted by the storage photon generator 170.

As depicted in FIG. 1, the pump laser 180 may be optically coupled to the chalcogenide optical fiber link 120 using a pump pulse transmission fiber 182 or other waveguide device, which may extend between the pump laser 180 and the photon receiving end 126 of the chalcogenide optical fiber link 120. Further, the pump laser 180 may be optically coupled to the photon receiving end 126 of the chalcogenide optical fiber link 120 using one or more alignment mechanisms 142 structurally configured to optically align the pump laser 180 with the core 122 of the chalcogenide optical fiber link 120. The one or more alignment mechanisms 142 may comprise an alignment stage, an optical switch, or both. Further, the pump laser 180 and/or the chalcogenide optical fiber link 120 may be coupled to individual alignment mechanisms 142.

Referring still to FIG. 1, the magnetic field generation unit 150 may comprise any magnetic device structurally and compositionally configured to generate a magnetic field, for example, a static magnetic field. As non-limiting examples, the magnetic field generation unit 150 may comprise an electromagnet, a ferromagnet, an alcnico magnet, a samarium cobalt (SmCo) magnet, a neodymium iron boron (NdFeB) magnet, or combinations thereof. Further, the magnetic field generation unit 150 is positioned within the quantum memory system 100 such that, when the magnetic field generation unit 150 generates a magnetic field, the chalcogenide optical fiber link 120 is positioned within the magnetic field of the magnetic field generation unit 150. For example, the magnetic field generation unit 150 may be adjacent the chalcogenide optical fiber link 120. As a non-limiting example, the magnetic field generation unit 150 may be structurally and compositionally configured to generate a magnetic field comprising a magnetic flux density of between about 0.2 tesla and about 5 tesla, such as about 0.4 tesla, 0.5 tesla, 0.6 tesla, 0.65 tesla, 0.7 tesla, 0.8 tesla, 1 tesla, 2 tesla, 2.5 tesla, 3 tesla, 4 tesla, or the like.

Figure 2:
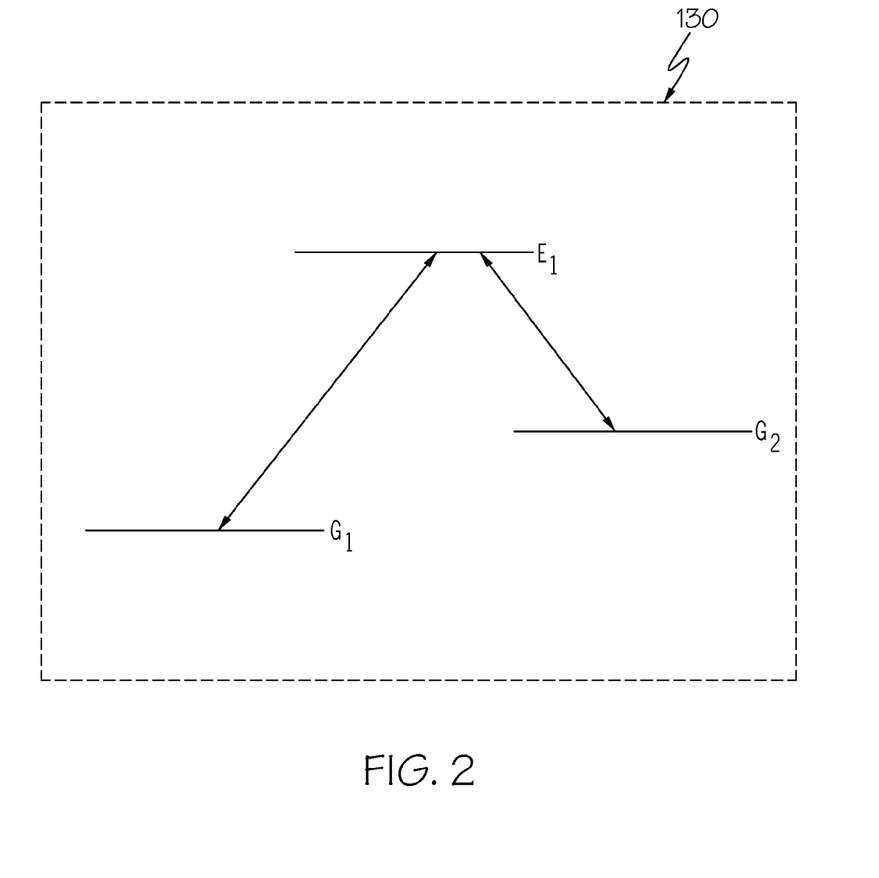
FIG. 2 is a schematic illustration of ground and excited energy states of an electron of the rare earth element dopant of FIG. 1, according to one or more embodiments shown and described herein.

As schematically depicted in FIG. 2, when the chalcogenide optical fiber link 120 is positioned within the magnetic field of the magnetic field generation unit 150, a ground state of the plurality of electrons of the rare-earth element dopant 130 is split such that each electron of the rare-earth element dopant 130 comprises a first split ground state $G_1$, a second split ground state $G_2$ and an excited energy state $E_1$. By splitting the ground state of the electrons of the rare-earth element dopant 130, the electron may be transferred into the second ground state $G_2$ to store the storage photon within the chalcogenide optical fiber link 120, as described below.

Referring again to FIG. 1, the quantum memory system 100 may further comprise a wavelength division multiplexer (WDM) 160 positioned adjacent and optically coupled to the photon output end 128 of the chalcogenide optical fiber link 120. The WDM 160 may be optically coupled to both a storage photon pathway 162 and a pump pulse pathway 164, for example, the WDM 160 may be positioned between the photon output end 128 and both the storage photon pathway 162 and the pump pulse pathway 164. The WDM 160 is configured to direct the storage photons into the storage photon pathway 162 and direct the pump pulses into the pump pulse pathway 164. For example, the WDM 160 may direct a wavelength range of photons encompassing the wavelengths of the storage photons into the storage photon pathway 162 and may direct a wavelength range of photons encompassing the wavelengths of the pump pulses into the pump pulse pathway 164. Further, the storage photon pathway 162 and the pump pulse pathway 164 may comprise optical fibers.

The storage photon pathway 162 may extend between the WDM 160 and a storage photon receiver 166. As one non-limiting example, the storage photon receiver 166 may comprise an optical fiber link of one or more photon entanglement chains of the quantum key generation system described in U.S. patent application Ser. No. 14/680,522. As another non-limiting example, the storage photon receiver 166 may comprise the entanglement optics 210 of the quantum repeater system 200 of FIG. 3. Further, the pump pulse pathway 164 may extend between the WDM 160 and a pump pulse receiver 168. In operation the first and second pump pulses may terminate at the pump pulse receiver 168, for example, the pump pulse receiver 168 may comprise a fiber end in embodiments in which the pump pulse pathway 164 comprises an optical fiber.

As depicted in FIG. 1, the quantum memory system 100 may further comprise a cooling system 190 thermally coupled to the chalcogenide optical fiber link 120. As a non-limiting example, the cooling system 190 may comprise a cooling chamber and the chalcogenide optical fiber link 120 may be positioned within the cooling chamber. As another non-limiting example, the cooling system 190 may comprise a laser cooling system and the chalcogenide optical fiber link 120 may be optically coupled to the laser cooling system. It should be understood that any cooling system 190 structurally configured to cool the chalcogenide optical fiber link 120 is contemplated.

In operation, the chalcogenide optical fiber link 120 comprising the core 122 doped with the rare-earth element dopant 130 is structurally and compositionally configured to absorb and store a storage photon emitted by the storage photon generator 170. For example, when the storage photon is traversing the chalcogenide optical fiber link 120, the storage photon may transfer an electron of the rare-earth element dopant 130 from the first split ground state $G_1$ to the excited energy state $E_1$, as schematically shown in FIG. 2, to absorb the storage photon. Further, upon receipt of a first pump pulse output by the pump laser 180, the first pump pulse may transfer the electron of the of the rare-earth element dopant 130 from the excited energy state $E_1$ into the second split ground state $G_2$, to store the storage photon. Moreover, the output from the pump laser may comprise a n-pulse.

Further, the chalcogenide optical fiber link 120 comprising the core 122 doped with the rare-earth element dopant 130 is structurally and compositionally configured to release, on demand, the storage photon stored within the chalcogenide optical fiber link 120. For example, upon receipt of a second pump pulse output by the pump laser 180, the electron of the rare-earth element dopant 130 is transferred from the second split ground state $G_2$ back to the excited energy state $E_1$. Once in the excited energy state $E_1$, the electron of the rare-earth element dopant 130 decays from the excited energy state to the first split ground state $G_1$, for example, after a decay period, such that the storage photon exits the photon output end 128 of the chalcogenide optical fiber link 120.

The decay period comprises a consistent, repeatable time period, thus, upon repeated operation, individual storage photons are released after the same decay period. Further, different chalcogenide optical fiber links 120 may comprise the same decay period. As a non-limiting example, chalcogenide optical fiber links 120 comprising the same glass and dopant composition may comprise equal decay periods. Thus, a pair of chalcogenide optical fiber links 120 having equivalent decay periods may be arranged as the quantum repeater system 200 of FIG. 3 and will each release storage photons simultaneously if they each receive the second pump pulse simultaneously, to facilitate quantum entanglement of storage photons using entanglement optics 210 of FIG. 3, as described below. Further, the decay period of individual chalcogenide optical fiber links 120 may be determined by performing a photon echo measurement on the individual chalcogenide optical fiber link 120.

Referring again to FIG. 1, the chalcogenide optical fiber link 120 may comprise a low phonon energy (e.g., Debye energy), which may limit unintended electron dephasing. Electron dephasing refers to phonon assisted coupling from a trapped electron orbital to a degenerate or nearly degenerate orbital. Unintended electron dephasing refers to energy state transfer (e.g. phonon assisted coupling) into the first ground state $G_1$ by the electron of the rare-earth element dopant 130, that causes unintentional release of the storage photon before the desired release of the storage photon. For example, unintended electron dephasing refers to electron dephasing that occurs before receipt of the first pump pulse or the second pump pulse by the chalcogenide optical fiber link 120. Further, lowering unintended electron dephasing may facilitate longer photon storage lifetimes and greater photon storage efficiency.

By lowering the phonon energy of the chalcogenide optical fiber link 120, the photon storage lifetime and the photon storage efficiency of the chalcogenide optical fiber link 120 may be increased. Photon storage lifetime refers to the maximum amount of time a storage photon may remain stored within the chalcogenide optical fiber link 120 before unintended electron decay causes the storage photon to be released. Further, photon storage efficiency refers to the percentage of storage photons traversing the chalcogenide optical fiber link 120 that are absorbed and stored. As one non-limiting example, the chalcogenide optical fiber link 120 having sulfide chalcogenide glass comprises a minimum phonon energy of about 425 $cm^{-1}$. As another non-limiting example, the chalcogenide optical fiber link 120 having selenide chalcogenide glass comprises a maximum phonon energy of about 350 $cm^{-1}$. For comparison, a silicate glass fiber link comprises a maximum phonon energy of as high as about 1100 $cm^{-1}$. Thus, the quantum memory system 100 comprising the chalcogenide optical fiber link 120 may comprise an increased photon storage lifetime and increased photon storage efficiency.

Moreover, the chalcogenide optical fiber link 120 comprises low attenuation, increasing the photon storage efficiency. For example, the chalcogenide optical fiber link 120 having sulfide chalcogenide glass comprises a lower attenuation than the chalcogenide optical fiber link 120 having selenide chalcogenide glass along a fiber length of about 1.5 μm, because the effective band gap of selenides is shifted to longer wavelengths than the effective band gap of sulfide chalcogenide glass. Thus, sulfide chalcogenide glass may be desirable for chalcogenide optical fiber links 120 that comprise lengths greater than about 1 μm (due to the lower attenuation) and selenide chalcogenide glass may be desirable for lengths less than about 1 μm, at least because selenide chalcogenide glass comprises a lower phonon energy than sulfide chalcogenide glass.

As a non-limiting example, the chalcogenide optical fiber link 120 may comprise between about 35% and about 90% of a chalcogen material (e.g., sulfur, selenium, tellurium or combinations thereof), and may further comprise between about 0% and about 35% Ge and between about 0% and about 45% As and/or Sb, where the sum of Ge material and As and/or Sb material is between about 10% and about 65%. Additionally the chalcogenide optical fiber link 120 may comprise between about 0.1% and about 10% Ga and/or In. Further, the chalcogen content of the chalcogenide optical fiber link 120 may comprise between about 50% and about 150% of the stoichiometric value of the chalcogenide optical fiber link 120 composition. As one non-limiting example, the chalcogenide optical fiber link 120 may comprise 25% Ge, 8.33% As, 1.67% Ga, 65% S, and 0.015% of a rare-earth element (e.g., the rare-earth element dopant 130). Further, including Ga or like materials within the chalcogenide optical fiber link 120 may prevent clustering of the rare-earth elements within the rare-earth element dopant 130, which reduces spin-spin interactions, thereby reducing unintended electron decay. Moreover, by cooling the chalcogenide optical fiber link 120, for example, using the cooling system 190, the phonon energy of the chalcogenide optical fiber link 120 may be reduced, increasing the photon storage lifetime and the photon storage efficiency of the chalcogenide optical fiber link 120.

The chalcogenide optical fiber link 120 doped with the rare-earth element dopant 130 also comprises a magnetic moment about 3 $\mu_N$ or less, for example, about 1 $\mu_N$ or less. In operation, lower magnetic moments are correlated with increased photon storage lifetime and photon storage efficiency because chalcogenide optical fiber links 120 comprising a low magnetic moment may also comprise low phonon energy, reducing unintended electron decay. As non-limiting example, elements such as Y, Sn, and Pb, which each comprise low magnetic moments, may also be present in the chalcogenide optical fiber link 120. Further, chalcogenide optical fiber links 120 comprising materials having higher atomic weights may be desired because heavier elements may also comprise lower phonon energy.

The chalcogenide optical fiber link 120 doped with the rare-earth element dopant 130 may also comprise a narrow homogeneous linewidth, which may increase the photon storage lifetime and photon storage efficiencies of the chalcogenide optical fiber link 120 doped with the rare-earth element dopant 130. In particular, a narrower homogeneous linewidth is directly correlated with a longer photon storage lifetime. As used herein, homogeneous linewidth refers the full-width half maximum (FWHM) spectral linewidth of the absorption peak (e.g., wavelength at which maximum absorption occurs) of the rare-earth element dopant 130 of the chalcogenide optical fiber link 120. The inhomogeneous linewidth the chalcogenide optical fiber link 120 doped with the rare-earth element dopant 130 may comprise between about 1 nm and about 25 nm, between about 5 nm and 15 nm, or the like, for example, 2 nm, 5 nm, 10 nm, 15 nm, 20 nm, or the like. Moreover, the homogeneous linewidth of the chalcogenide optical fiber link 120 doped with the rare-earth element dopant 130 may comprise about 7.5 MHz or less, for example, 7 MHz, 6 MHz, 5 MHz 4 MHz, 3 MHz, 2 MHz, 1 MHz, or the like.

As one non-limiting example, the absorption peak of the chalcogenide optical fiber link 120 doped with the rare-earth element dopant 130 comprising erbium may be between about 1510 nm and about 1550 nm, for example, between about 1535 nm and about 1545 nm, such as 1540 nm. As another non-limiting example, the absorption peak of the chalcogenide optical fiber link 120 doped with the rare-earth element dopant 130 comprising thulium may be between about 1600 nm and about 1700 nm, for example, between about 1625 nm and about 1675 nm, such as 1660 nm. Further, in operation, the chalcogenide optical fiber link 120 doped with the rare-earth element dopant 130 is configured to absorb and store a storage photon traversing the chalcogenide optical fiber link 120, as described above, upon receipt of a first pump pulse output by the pump laser 180 that comprises a wavelength within 15 nm of the wavelength of the absorption peak, for example, within 10 nm, within 5 nm, or equal to the wavelength of the absorption peak. Further, the chalcogenide optical fiber link 120 doped with the rare-earth element dopant may release the storage photon, as described above, upon receipt of a second pump pulse output by the pump laser 180 that comprises a wavelength within 15 nm of the wavelength of the absorption peak, for example, within 10 nm, within 5 nm, or equal to the wavelength of the absorption peak.

The relationship between photon storage lifetime and homogeneous linewidth may be mathematically described with the following equations:

$$\rho_1 = \frac{1}{c} \frac{3}{2\pi\rho v^5 \hbar^4} |\langle \psi_i^{el} | V_1 | \psi_j^{el} \rangle|^2$$

and $$\rho_2 = \frac{1}{c} \frac{3}{2\pi\rho v^2 \hbar^4} |\langle \psi_i^{el} | V_2 | \psi_i^{el} \rangle|^2,$$

where, $V_1$ is the first spatial derivative of the crystal field of the chalcogenide optical fiber link 120, $V_2$ is the second spatial derivative of the crystal field of the chalcogenide optical fiber link 120, $\rho_1$ is the probability amplitude of the transition due to the $V_1$, $\rho_2$ is the probability of the transition due to $V_2$, c is the speed of light, $\rho$ is the density of the host material, for example, the chalcogenide optical fiber link 120, v is the average velocity of a sound wave in the crystal, $\psi_i^{el}$ is the ground state of the electron (e.g., the electron of the rare-earth element dopant 130), and $\psi_j^{el}$ is the excited state of the electron (e.g., the electron of the rare-earth element dopant 130). Further, a phonon coupling coefficient $\beta_{ij}$ may be mathematically described as $\beta_{ij} = \hbar^3 c \omega_{ij}^3 \rho_1$, where c is the speed of light, $\omega_i$ is the homogeneous linewidth of the chalcogenide optical fiber link 120, and $\rho_1$ is the is the first order probability amplitude of the transition. As shown above, smaller (e.g., narrower) homogeneous linewidths generate smaller photon coupling coefficients. Further, a small phonon coupling coefficient is correlated with low phonon energy and low phonon energy facilitates longer photon storage lifetimes. Thus, the homogeneous linewidth is inversely proportional to the photon storage lifetime and narrower homogeneous linewidth facilitate longer photon storage lifetimes.

Combining the above equations, the homogeneous lifetime may also be mathematically described as $$w_i^{hom}(\text{cm}^{-1}) = \frac{2\hbar c(kT_D)^7}{\pi} \left[ \sum_{i \neq j} \frac{p_1}{E_i - E_j} + p_2 \right]^2 \left(\frac{T}{T_D}\right)^7 \int_0^{T_D/T} \frac{x^6 e^x}{(e^x - 1)^2} dx +$$

$$p_1 \left\{ \sum_{j<i} \Delta E_{ij}^3 \left( \frac{e^{\Delta E_{ij}/kT}}{e^{\Delta E_{ij}/kT} - 1} \right) + \sum_{j>i} \Delta E_{ji}^3 \left( \frac{1}{e^{\Delta E_{ji}/kT} - 1} \right) \right\}$$

where c is the speed of light, k is the Boltzmann constant, T is the temperature (e.g., the temperature of the chalcogenide optical fiber link 120), $T_D$ is the Debye temperature, $\rho_1$ is the first order probability amplitude of the transition, $\rho_2$ is the second order probability amplitude of the transition, and E is the energy level.

In some embodiments, the rare-earth element dopant 130 may comprise a non-Kramers rare-earth ion, such as $Pr^{3+}$, $Tm^{3+}$, or the like. Chalcogenide optical fiber links 120 doped with the non-Kramers rare-earth ions may comprise a narrower homogeneous linewidth than chalcogenide optical fiber link 120 comprising Kramers rare earth ions, for example, due to the lack of Kramers degeneracy of non-Kramers rare-earth ions. This may increase the photon storage lifetime of the chalcogenide optical fiber link 120 and reducing unintended electron decay. Moreover, when the rare-earth element dopant 130 comprises thulium, the electrons of the rare-earth element dopant 130 comprising thulium may split into first and second ground states $G_1$ and $G_2$ (FIG. 2) when positioned within a weaker magnetic field than a rare-earth element dopant 130 comprising erbium.

Referring again to FIGS. 1 and 2, a method of storing and releasing a storage photon using the quantum memory system 100 is contemplated. While the method is described below in a particular order, it should be understood that other orders are contemplated. Referring now to FIG. 1, the method may first comprise generating a magnetic field using the magnetic field generation unit 150. As stated above, generating a magnetic field using a magnetic field generation unit 150 causes the ground state of electrons of the rare-earth element dopant 130 doped within the core 122 is split into the first ground state $G_1$ and the second ground state $G_2$, as depicted in FIG. 2.

The method further comprises emitting a storage photon from the storage photon generator 170 optically coupled to the photon receiving end 126 of the chalcogenide optical fiber link 120 and upon receipt of the storage photon by the chalcogenide optical fiber link 120, the core 122 doped with the rare-earth element dopant 130 absorbs the storage photon by transferring an electron of the rare-earth element dopant 130 from the first split ground state $G_1$ to the excited energy state $E_1$. Next, the method further comprises emitting a first pump pulse from the pump laser 180 optically coupled to the photon receiving end 126 of the chalcogenide optical fiber link 120 such that the first pump pulse transfers the electron of the rare-earth element dopant 130 from the excited energy state to a second split ground state, upon receipt of the first pump pulse by the chalcogenide optical fiber link 120, to store the storage photon within the core 122 doped with the rare-earth element dopant 130.

Referring still to FIGS. 1 and 2, the method further comprises emitting a second pump pulse from the pump laser 180 such that the second pump pulse transfers the electron of the rare-earth element dopant 130 from the second split ground state $G_2$ to the excited energy state $E_1$, upon receipt of the second pump pulse by the chalcogenide optical fiber link 120. Once back in the excited energy state $E_1$, the electron of the rare-earth element dopant 130 decays from the excited energy state $E_1$ to the first split ground state after a decay period. After the electron decays into the first split ground state $G_1$ such that the storage photon exits the photon output end 128 of the chalcogenide optical fiber link 120.

Further, in operation, the quantum memory system 100 and more particularly, the core 122 of the chalcogenide optical fiber link 120 doped with a rare-earth element dopant 130 may absorb and store a storage photon for a photon storage lifetime comprising between about 1 ns and about 1 μs, for example, between about 1 ns and about 500 ns or between about 1 ns and about 100 ns. Moreover, in operation, the quantum memory system 100 and, more particularly, the core 122 of the chalcogenide optical fiber link 120 doped with a rare-earth element dopant 130 may absorb and store about 50% or more of a plurality of storage photons traversing the chalcogenide optical fiber link 120, for example, about 70% or more of the plurality of storage photons traversing the chalcogenide optical fiber link 120, about 90% or more of the plurality of storage photons traversing the chalcogenide optical fiber link 120, or the like.

Referring now to FIG. 3, a quantum repeater system 200 comprising first and second chalcogenide optical fiber links 220a, 220b, one or more magnetic field generation units 250, first and second storage photon generators 270a, 270b, first and second pump lasers 280a, 280b, and entanglement optics 210 is schematically depicted. The first and second chalcogenide optical fiber links 220a, 220b may each comprise the chalcogenide optical fiber link 120 described above with respect to the quantum memory system 100. For example, the first and second chalcogenide optical fiber links 220a, 220b comprise a photon receiving end 226a, 226b opposite the photon output end 228a, 228b and a core 222a, 222b encircled by a cladding layer 224a, 224b. Further the cores 222a, 222b of the chalcogenide optical fiber links 220a, 220b may be doped with a rare-earth element dopant 230a, 230b, for example, any of the rare-earth element dopants 130 described above. Moreover, the quantum repeater system 200 may further comprise a cooling system 290 thermally coupled to each chalcogenide optical fiber link 220a, 220b. The cooling system 290 may comprise any of the cooling systems 190 described above.

The one or more magnetic field generation units 250 may comprise the magnetic field generation units 150 described above. Further, the first and second chalcogenide optical fiber links 220a, 220b are positioned within a magnetic field of the one or more magnetic field generation units 250 when the one or more magnetic field generation units 250 generate magnetic fields. Further, while a single magnetic field generation unit 250 is depicted in FIG. 3, it should be understood that any number of magnetic field generation units 250 are contemplated. For example, the first and second chalcogenide optical fiber links 220a, 220b may be positioned within the magnetic fields of different magnetic field generation units 250.

Referring still to FIG. 3, the one or more storage photon generators 270a, 270b are optically coupled to the photon receiving end 226a, 226b of each chalcogenide optical fiber link 220a, 220b. For example, the first storage photon generators 270a may be optically coupled to the photon receiving end 226a of the first chalcogenide optical fiber link 220a and the second storage photon generators 270b may be optically coupled to the photon receiving end 226b of the chalcogenide optical fiber link 120 and second chalcogenide optical fiber link 220b. The one or more storage photon generators 270a, 270b may comprise any of the storage photon generators 170 described above.

Further, one or more pump lasers 280a, 280b are optically coupled to the photon receiving end 226 of each chalcogenide optical fiber link 220. For example, the first pump laser 280a may be optically coupled to the photon receiving end 226a of the first chalcogenide optical fiber link 220a and the second pump laser 280b may be optically coupled to the photon receiving end 226b of the chalcogenide optical fiber link 120 and second chalcogenide optical fiber link 220b. The one or more pump lasers 280a, 280b may comprise any of the pump lasers 180 described above. The one or more storage photon generators 170a, 170b, the one or more pump lasers 180a, 180b and/or the chalcogenide optical fiber links 220a, 220b may be coupled to one or more alignment mechanisms 242 to optically align the one or more storage photon generators 170a, 170b and the one or more pump lasers 180a, 180b with the chalcogenide optical fiber links 220a, 220b. Further, the one or more alignment mechanisms 242 may comprise any of the alignment mechanisms 142 described above. Moreover, the chalcogenide optical fiber link 220a, 220b comprising the core 222a, 222b doped with rare-earth element dopants 230a, 230b are configured to absorb and release storage photons as described above with respect to FIGS. 1 and 2.

As depicted in FIG. 3, the quantum repeater system 200 may further comprise first and second WDMs 260a, 260b, positioned adjacent and optically coupled to the photon output ends 228a, 228b of the chalcogenide optical fiber links 220a, 220b. The WDMs 260a, 260b may each comprise the WDM 160 described above. Further, WDMs 260a, 260b may be optically coupled to both storage photon pathways 262a, 262b and pump pulse pathways 264a, 264b for example, the WDMs 260a, 260b may be positioned between the photon output ends 228a, 228b and both the storage photon pathway 162 and the pump pulse pathway 164.

Further, the storage photon pathways 262a, 262b may extend between the WDMs 260a, 260b and the entanglement optics 210. For example, the first storage photon pathway 262a may extend between and optically couple the first WDM 260*a* and a first entangling pathway 212*a* of the entanglement optics 210. Further, the second storage photon pathway 262*b* may extend between and optically couple the second WDM 260*b* and a second entangling pathway 212*b* of the entanglement optics 210. Further, the pump pulse pathways 264*a*, 264*b* may extend between the WDMs 260*a*, 260*b* and pump pulse receivers 268*a*, 268*b*, which may comprise the pump pulse receiver 168, described above Referring still to FIG. 3, the entanglement optics 210 comprise two entangling pathways 212*a*, 212*b* optically coupled to and the photon output ends 228*a*, 228*b* of each chalcogenide optical fiber link 220*a*, 220*b*, for example, using the first and second WDMs 260*a*, 260*b* and the first and second storage photon pathways 262*a*, 262*b*. The two entangling pathways 212*a*, 212*b* may also be optically coupled to two entanglement detectors 214*a*, 214*b*. The entanglement optics 210 further comprise a beamsplitter 216 positioned such that each entangling pathway 212*a*, 212*b* traverses the beamsplitter 216. Further the two entanglement detectors 214*a*, 214*b* may each comprise one or more single-photon detectors, e.g., superconducting nanowire single-photon detectors, low noise photodiodes, or the like. In operation, the entanglement optics 210 are structurally configured to entangle pairs of storage photons when storage photons output by the photon output ends 228*a*, 228*b* of each chalcogenide optical fiber link 220*a*, 220*b* simultaneously traverse the beamsplitter 216.

In operation, each chalcogenide optical fiber link 220*a*, 220*b* comprising the core 222*a*, 222*b* doped with the rare-earth element dopant 230*a*, 230*b* is structurally and compositionally configured to absorb and store individual storage photons emitted by the storage photon generators 270*a*, 270*b*. For example, when the storage photons are traversing each chalcogenide optical fiber link 220*a*, 220*b*, each storage photons may each transfer an electron of the rare-earth element dopants 230*a*, 230*b* from the first split ground state $G_1$ to the excited energy state $E_1$, as schematically shown in FIG. 2, to absorb each respective storage photon in each respective chalcogenide optical fiber link 220*a*, 220*b*. Further, upon receipt of a first pump pulse output by each pump laser 280*a*, 280*b*, each first pump pulse may transfer the electron of the rare-earth element dopant 230*a*, 230*b* of each respective chalcogenide optical fiber link 220*a*, 220*b* from the excited energy state $E_1$ into the second split ground state $G_2$, to store each storage photon.

Each chalcogenide optical fiber link 220*a*, 220*b* comprising the core 222*a*, 222*b* doped with the rare-earth element dopant 230*a*, 230*b* is also structurally and compositionally configured to release, on demand, the storage photon stored within each chalcogenide optical fiber link 220*a*, 220*b*. For example, upon receipt of a second pump pulse output by each pump laser 280*a*, 280*b*, the electron of the rare-earth element dopants 230*a*, 230*b* is transferred from the second split ground state $G_2$ back to the excited energy state $E_1$. Once in the excited energy state $E_1$, the electrons of the rare-earth element dopants 230*a*, 230*b* decay from the excited energy state to the first split ground state $G_1$, for example, after the decay period, such that the storage photons exit the photon output ends 228*a*, 228*b* of the chalcogenide optical fiber link 220*a*, 220*b*.

Further, if the first and second pump lasers 280*a*, 280*b* emit second pump pulses that are simultaneously received by the first and second chalcogenide optical fiber links 220*a*, 220*b* (e.g., by emitting the second pump pulses simultaneously), the first and second chalcogenide optical fiber links 220*a*, 220*b* will simultaneously release the storage photons (after the decay period), allowing the storage photons to simultaneously traverse the beamsplitter 216 of the entanglement optics 210, entangling the storage photons. Moreover, because the chalcogenide optical fiber links 220*a*, 220*b* comprise long photon storage lifetimes, one chalcogenide optical fiber link 220*a*/220*b* may absorb and store a first storage photon before the other chalcogenide optical fiber link 220*a*/220*b* absorbs and stores a second storage photon, allowing storage photons that are not simultaneously received by the chalcogenide optical fiber links 220*a*, 220*b* to be simultaneously released by the chalcogenide optical fiber links 220*a*, 220*b* and entangled by the entanglement optics 210.

Figure 4:
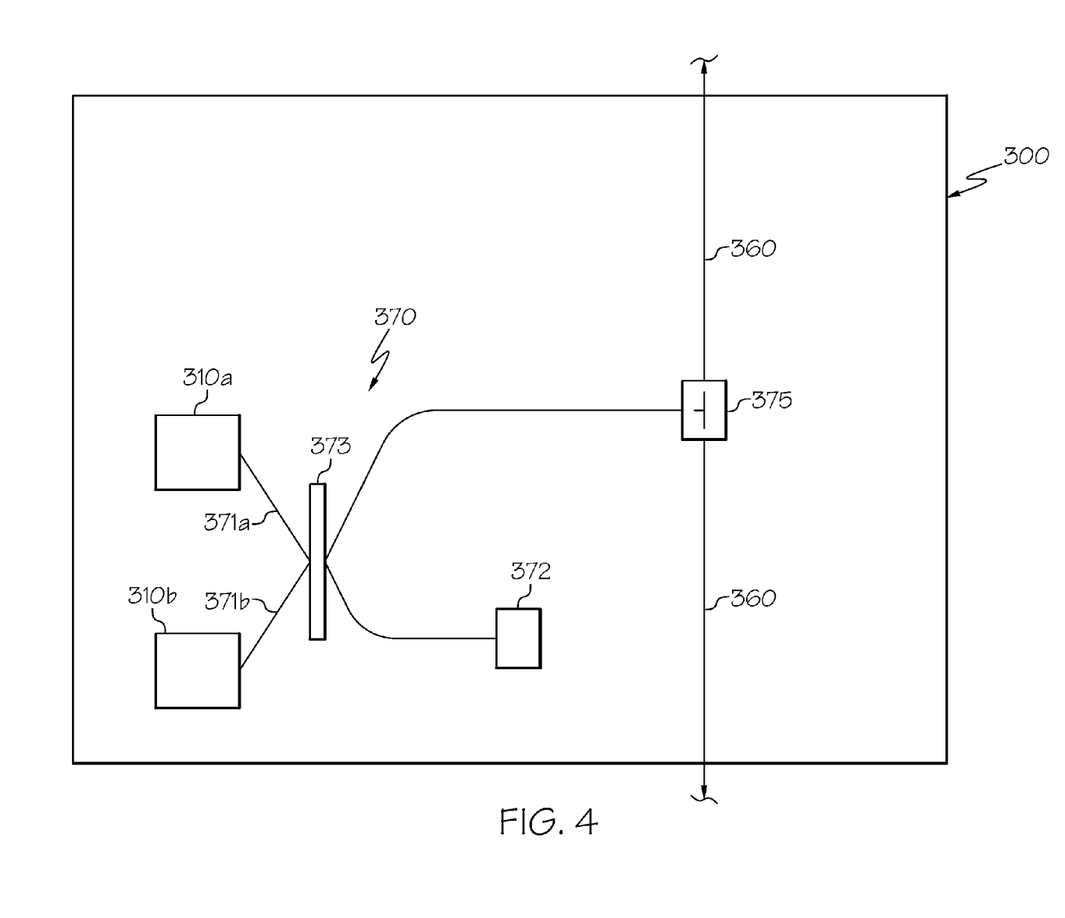
FIG. 4 schematically depicts an example entangled photon generator comprising the quantum repeater system of FIG. 3, according to one or more embodiments shown and described herein.

Referring now to FIG. 4, a non-limiting embodiment of an entangled photon generator 300 is depicted. The entangled photon generator 300 is structurally configured to generate four or more entangled photons, for example, two or more entangled pairs of photons. The entangled photon generator 300 may be positioned in one or more photon entanglement chains of a quantum key generation system, for example, the quantum key generation systems described in U.S. patent application Ser. No. 14/680,522. As depicted in FIG. 4, the entangled photon generator 300 may comprise first and second quantum repeater systems 310*a*, 310*b* (each configured to output an entangled pair of photons), entanglement optics 370, a pathway splitter 375, and an entanglement detector 372. The first and second quantum repeaters systems 310*a*, 310*b* may comprise any of the quantum repeater systems 200, described above.

In some embodiments, the first and second quantum repeater systems 310*a*, 310*b* may comprise entanglement optics (e.g., the entanglement optics 210 of FIG. 3, above) that do not include two entanglement detectors 214*a*, 214*b* such that each entangling pathway 212*a*, 212*b* may be optically coupled to the entanglement optics 370 of the entangled photon generator 300. In other embodiments, the first and second quantum repeater system 310*a*, 310*b* may include the entanglement detectors 214*a*, 214*b* and the entanglement optics 370 of the entangled photon generator 300 may be optically coupled to each entangling pathway 212*a*, 212*b*, for example, when the entanglement detectors 214*a*, 214*b* are structurally configured to detect the storage photons without the storage photons terminating therein.

Referring still to FIG. 4, the entanglement optics 370 may comprise a first entangling pathway 371*a* optically coupled to and extending between a first quantum repeater system 310*a* and the entanglement detector 372 and a second entangling pathway 371*b* optically coupled to and extending between a second quantum repeater system 310*b* and the pathway splitter 375. Additional entangling pathways 371 are contemplated in embodiments comprising additional quantum repeater systems 310. In some embodiments, the entanglement optics 370 further comprise a beamsplitter 373 positioned such that each entangling pathway 371*a*, 371*b* traverses the beamsplitter 373. In operation, the entanglement optics 370 are structurally configured to entangle multiple photons (e.g., storage photons) when the multiple photons simultaneously traverse the beamsplitter 373. For example, when each entangled pair of photons output by the first and second quantum repeater systems 310*a*, 310*b* simultaneously traverse the beamsplitter 373, all four photons are entangled with each other.

Further, the entanglement optics 370 are configured such that some or all of the entangled photons output by each of the first and second quantum repeater systems 310*a*, 310*b* are received by the entanglement detector 372 and/or the pathway splitter 375. For example, when a first entangled pair of photons are output by the first quantum repeater system 310a and a second entangled pair of photons are output by the second quantum repeater system 310b and these two entangled pairs of photons are entangled with each other at the beamsplitter 373, there is a probability that one of at least three outcomes occur, which are mathematically described by the wave function:

$$\psi_{AA'} = -\left[\frac{1}{2}\left|2,2\right\rangle + \sqrt{\frac{3}{8}}\left(\left|4,0\right\rangle + \left|0,4\right\rangle\right)\right].$$

In a first outcome, both the entanglement detector 372 and the pathway splitter 375 receive two of the four entangled photons, mathematically described by the ket |2,2⟩ in the above wave function. In a second outcome, the entanglement detector 372 receives the four entangled photons, mathematically described by one of the kets |4,0⟩ or |4,0⟩ in the above wave function. In a third outcome, the pathway splitter 375 receives the four entangled photons, mathematically described by one of the kets |4,0⟩ or |4,0⟩ in the above wave function. In some embodiments, the probability that the pathway splitter 375 receives the four entangled photons is about ⅜. Further, embodiments comprising additional parametric down conversion generators are contemplated such that additional entangled pairs of photons (e.g., N entangled photons) may be entangled by the entanglement optics 370. In an embodiment comprising N entangled photons, the probability that the N entangled photons are received by the entanglement detector 372, the pathway splitter 375, or a combination of both is mathematically described by the generalized ket:

$$|N, N\rangle_{out} = \frac{i^N}{N!2^N} \sum_{p=0}^{N} \binom{N}{p} \sqrt{(2p)!(2N-2p)!} |2p, 2N-2p\rangle.$$

Further, in some embodiments, at least a portion of both the first and second entangling pathways 371a, 371b may comprise multicore optical fibers. For example, a portion of the first entangling pathway 371a that extends between the beamsplitter 373 and the pathway splitter 375 and a portion of the second entangling pathway 371b that extends between the beamsplitter 373 and the pathway splitter 375 may each comprise multicore optical fiber. In some embodiments, at least a portion of both the first and second entangling pathways 371a, 371b may comprise one or more optical waveguides.

In some embodiments, the pathway splitter 375 is structurally configured to direct entangled pairs of photons into optical fiber links 360 optically coupled to the pathway splitter 375. For example, when the pathway splitter 375 receives four entangled photons, the pathway splitter 375 may direct two of the four entangled photons into one optical fiber link 360 and the pathway splitter 375 may direct two of the four entangled photons into another optical fiber link 360. The optical fiber links 360 may comprise any optical fiber, for example, a glass optical fiber comprising a single core or comprising multiple cores. Further, in embodiments when the entangled photon generator 300 is configured to generate more than four entangled photons, the pathway splitter 375 may direct a first subset (e.g., about half) of the entangled photons into one optical fiber link 360 (e.g., a first optical fiber link) and the pathway splitter 375 may also direct a second subset (e.g., about half) of the entangled photons into another optical fiber link 360 (e.g., a second optical fiber link). In some embodiments, the pathway splitter 375 may comprise a fused biconical taper splitter, a planar lightwave circuit splitter, or the like.

In some embodiments, the entanglement detector 372 is structurally configured to measure the number of photons received by the entanglement detector 372, which also provides information regarding the number of photons received by the pathway splitter 375. For example, if two entangled photons are output by each of the first and second quantum repeater systems 310a, 310b and zero entangled photons are received by the entanglement detector 372, than all four entangled photons are received by the pathway splitter 375. In some embodiments, the entanglement detector 372 may comprise a multi-photon detector. In alternative embodiments, the entanglement detector 372 may comprise a single-photon detector, e.g., a superconducting nanowire single-photon detector, a low noise photodiode, or the like.

It is noted that recitations herein of a component of the present disclosure being "configured" in a particular way, to embody a particular property, or to function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

For the purposes of describing and defining the present invention it is noted that the term "about" is utilized herein to represent the inherent degree of uncertainty that may be attributed to any quantitative comparison, value, measurement, or other representation. The term "about" is also utilized herein to represent the degree by which a quantitative representation may vary from a stated reference without resulting in a change in the basic function of the subject matter at issue.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Further, it will be apparent that modifications and variations are possible without departing from the scope of the present disclosure, including, but not limited to, embodiments defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

The invention claimed is:

1. A quantum memory system comprising a chalcogenide optical fiber link, a magnetic field generation unit and a pump laser, wherein:
    the chalcogenide optical fiber link comprises a photon receiving end opposite a photon output end;

the chalcogenide optical fiber link is positioned within a magnetic field of the magnetic field generation unit when the magnetic field generation unit generates the magnetic field;
the pump laser is optically coupled to the photon receiving end of the chalcogenide optical fiber link;
the chalcogenide optical fiber link comprises sulfur, selenium, tellurium, or combinations thereof;
the chalcogenide optical fiber link comprises a core doped with a rare-earth element dopant;
the rare-earth element dopant is configured to absorb a storage photon traversing the chalcogenide optical fiber link when (i) the storage photon transfers an electron of the rare-earth element dopant from a first split ground state to an excited energy state and (ii), upon receipt of a first pump pulse output by the pump laser, the first pump pulse transfers the electron of the of the rare-earth element dopant from the excited energy state into a second split ground state; and
the rare-earth element dopant is configured to release the storage photon when (i) the electron of the of the rare-earth element dopant is transferred from the second split ground state to the excited energy state, upon receipt of a second pump pulse output by the pump laser and (ii) the electron of the rare-earth element dopant decays from the excited energy state to the first split ground state such that the storage photon exits the photon output end of the chalcogenide optical fiber link.

2. The quantum memory system of claim 1, wherein the chalcogenide optical fiber link comprises between about 35% and about 90% of one or more of sulfur, selenium, tellurium, or a combination thereof.

3. The quantum memory system of claim 2, wherein:
the chalcogenide optical fiber link comprises between about 10% and about 65% Ge, As, Sb, or a combination thereof; and
the chalcogenide optical fiber link comprises between about 35% or less of Ge and about 45% or less of As, Sb, or both.

4. A quantum memory system comprising a chalcogenide optical fiber link, a magnetic field generation unit and a pump laser, wherein:
the chalcogenide optical fiber link comprises a photon receiving end opposite a photon output end;
the chalcogenide optical fiber link is positioned within a magnetic field of the magnetic field generation unit when the magnetic field generation unit generates the magnetic field;
the pump laser is optically coupled to the photon receiving end of the chalcogenide optical fiber link;
the chalcogenide optical fiber link comprises a core doped with a rare-earth element dopant;
the chalcogenide optical fiber link doped with the rare-earth element dopant comprises an inhomogeneous linewidth of about 25 nm or less;
the rare-earth element dopant is configured to absorb a storage photon traversing the chalcogenide optical fiber link when (i) the storage photon transfers an electron of the rare-earth element dopant from a first split ground state to an excited energy state and (ii), upon receipt of a first pump pulse output by the pump laser, the first pump pulse transfers the electron of the of the rare-earth element dopant from the excited energy state into a second split ground state; and
the rare-earth element dopant is configured to release the storage photon when (i) the electron of the of the rare-earth element dopant is transferred from the second split ground state to the excited energy state, upon receipt of a second pump pulse output by the pump laser and (ii) the electron of the rare-earth element dopant decays from the excited energy state to the first split ground state such that the storage photon exits the photon output end of the chalcogenide optical fiber link.

5. A quantum memory system comprising a chalcogenide optical fiber link, a magnetic field generation unit and a pump laser, wherein:
the chalcogenide optical fiber link comprises a photon receiving end opposite a photon output end;
the chalcogenide optical fiber link is positioned within a magnetic field of the magnetic field generation unit when the magnetic field generation unit generates the magnetic field;
the pump laser is optically coupled to the photon receiving end of the chalcogenide optical fiber link;
the chalcogenide optical fiber link comprises a core doped with a rare-earth element dopant;
the chalcogenide optical fiber link doped with the rare-earth element dopant comprises a homogeneous linewidth of about 5 MHz or less;
the rare-earth element dopant is configured to absorb a storage photon traversing the chalcogenide optical fiber link when (i) the storage photon transfers an electron of the rare-earth element dopant from a first split ground state to an excited energy state and (ii), upon receipt of a first pump pulse output by the pump laser, the first pump pulse transfers the electron of the of the rare-earth element dopant from the excited energy state into a second split ground state; and
the rare-earth element dopant is configured to release the storage photon when (i) the electron of the of the rare-earth element dopant is transferred from the second split ground state to the excited energy state, upon receipt of a second pump pulse output by the pump laser and (ii) the electron of the rare-earth element dopant decays from the excited energy state to the first split ground state such that the storage photon exits the photon output end of the chalcogenide optical fiber link.

6. The quantum memory system of claim 1, wherein the chalcogenide optical fiber link doped with the rare-earth element dopant comprises a magnetic moment about 3 $\mu_N$ or less.

7. A quantum memory system comprising a chalcogenide optical fiber link, a magnetic field generation unit and a pump laser, wherein:
the chalcogenide optical fiber link comprises a photon receiving end opposite a photon output end;
the chalcogenide optical fiber link is positioned within a magnetic field of the magnetic field generation unit when the magnetic field generation unit generates the magnetic field;
the pump laser is optically coupled to the photon receiving end of the chalcogenide optical fiber link;
the chalcogenide optical fiber link comprises a core doped with a rare-earth element dopant;
the chalcogenide optical fiber link doped with the rare-earth element dopant comprises a phonon energy of between about 350 $cm^{-1}$ and about 425 $cm^{-1}$;
the rare-earth element dopant is configured to absorb a storage photon traversing the chalcogenide optical fiber link when (i) the storage photon transfers an electron of the rare-earth element dopant from a first split ground state to an excited energy state and (ii), upon receipt of a first pump pulse output by the pump laser, the first pump pulse transfers the electron of the of the rare-earth element dopant from the excited energy state into a second split ground state; and the rare-earth element dopant is configured to release the storage photon when (i) the electron of the of the rare-earth element dopant is transferred from the second split ground state to the excited energy state, upon receipt of a second pump pulse output by the pump laser and (ii) the electron of the rare-earth element dopant decays from the excited energy state to the first split ground state such that the storage photon exits the photon output end of the chalcogenide optical fiber link.

8. A quantum memory system comprising a chalcogenide optical fiber link, a magnetic field generation unit and a pump laser, wherein:

the chalcogenide optical fiber link comprises a photon receiving end opposite a photon output end;

the chalcogenide optical fiber link is positioned within a magnetic field of the magnetic field generation unit when the magnetic field generation unit generates the magnetic field;

the pump laser is optically coupled to the photon receiving end of the chalcogenide optical fiber link;

the chalcogenide optical fiber link comprises a core doped with a rare-earth element dopant;

the rare-earth element dopant comprises erbium, thulium, praseodymium, or a combination thereof;

the rare-earth element dopant is configured to absorb a storage photon traversing the chalcogenide optical fiber link when (i) the storage photon transfers an electron of the rare-earth element dopant from a first split ground state to an excited energy state and (ii), upon receipt of a first pump pulse output by the pump laser, the first pump pulse transfers the electron of the of the rare-earth element dopant from the excited energy state into a second split ground state; and the rare-earth element dopant is configured to release the storage photon when (i) the electron of the of the rare-earth element dopant is transferred from the second split ground state to the excited energy state, upon receipt of a second pump pulse output by the pump laser and (ii) the electron of the rare-earth element dopant decays from the excited energy state to the first split around state such that the storage photon exits the photon output end of the chalcogenide optical fiber link.

9. A quantum memory system comprising a chalcogenide optical fiber link, a magnetic field generation unit and a pump laser, wherein:

the chalcogenide optical fiber link comprises a photon receiving end opposite a photon output end;

the chalcogenide optical fiber link is positioned within a magnetic field of the magnetic field generation unit when the magnetic field generation unit generates the magnetic field;

the pump laser is optically coupled to the photon receiving end of the chalcogenide optical fiber link;

the chalcogenide optical fiber link comprises a core doped with a rare-earth element dopant;

the rare-earth element dopant comprises a non-Kramers rare-earth ion;

the rare-earth element dopant is configured to absorb a storage photon traversing the chalcogenide optical fiber link when (i) the storage photon transfers an electron of the rare-earth element dopant from a first split ground state to an excited energy state and (ii), upon receipt of a first pump pulse output by the pump laser, the first pump pulse transfers the electron of the of the rare-earth element dopant from the excited energy state into a second split ground state; and the rare-earth element dopant is configured to release the storage photon when (i) the electron of the of the rare-earth element dopant is transferred from the second split ground state to the excited energy state, upon receipt of a second pump pulse output by the pump laser and (ii) the electron of the rare-earth element dopant decays from the excited energy state to the first split ground state such that the storage photon exits the photon output end of the chalcogenide optical fiber link.

10. A quantum memory system comprising a chalcogenide optical fiber link, a magnetic field generation unit and a pump laser, wherein:

the chalcogenide optical fiber link comprises a photon receiving end opposite a photon output end;

the chalcogenide optical fiber link is positioned within a magnetic field of the magnetic field generation unit when the magnetic field generation unit generates the magnetic field;

the pump laser is optically coupled to the photon receiving end of the chalcogenide optical fiber link;

the chalcogenide optical fiber link comprises a core doped with a rare-earth element dopant;

the rare-earth element dopant comprises between about 0.01% to about 2.0% of a total molecular weight of the chalcogenide optical fiber link;

the rare-earth element dopant is configured to absorb a storage photon traversing the chalcogenide optical fiber link when (i) the storage photon transfers an electron of the rare-earth element dopant from a first split ground state to an excited energy state and (ii), upon receipt of a first pump pulse output by the pump laser, the first pump pulse transfers the electron of the of the rare-earth element dopant from the excited energy state into a second split ground state; and the rare-earth element dopant is configured to release the storage photon when (i) the electron of the of the rare-earth element dopant is transferred from the second split ground state to the excited energy state, upon receipt of a second pump pulse output by the pump laser and (ii) the electron of the rare-earth element dopant decays from the excited energy state to the first split ground state such that the storage photon exits the photon output end of the chalcogenide optical fiber link.

11. The quantum memory system of claim 1, wherein the magnetic field generation unit comprises an electromagnet.

12. The quantum memory system of claim 1, wherein the magnetic field generation unit comprises a ferromagnet, an alcnico magnet, a samarium cobalt magnet (SmCo), a neodymium iron boron magnet (NdFeB), or a combination thereof.

13. The quantum memory system of claim 1, further comprising a pump pulse transmission fiber extending between the pump laser and the photon receiving end of the chalcogenide optical fiber link.

14. A quantum memory system comprising a chalcogenide optical fiber link, a magnetic field generation unit, a pump laser, and a wavelength division multiplexer, wherein:

the chalcogenide optical fiber link comprises a photon receiving end opposite a photon output end;

the wavelength division multiplexer is optically coupled to the photon output end of the chalcogenide optical fiber link;

the chalcogenide optical fiber link is positioned within a magnetic field of the magnetic field generation unit when the magnetic field generation unit generates the magnetic field;

the pump laser is optically coupled to the photon receiving end of the chalcogenide optical fiber link;

the chalcogenide optical fiber link comprises sulfur, selenium, tellurium, or combinations thereof;

the chalcogenide optical fiber link comprises a core doped with a rare-earth element dopant;

the rare-earth element dopant is configured to absorb a storage photon traversing the chalcogenide optical fiber link when (i) the storage photon transfers an electron of the rare-earth element dopant from a first split ground state to an excited energy state and (ii), upon receipt of a first pump pulse output by the pump laser, the first pump pulse transfers the electron of the of the rare-earth element dopant from the excited energy state into a second split ground state; and the rare-earth element dopant is configured to release the storage photon when (i) the electron of the of the rare-earth element dopant is transferred from the second split ground state to the excited energy state, upon receipt of a second pump pulse output by the pump laser and (ii) the electron of the rare-earth element dopant decays from the excited energy state to the first split ground state such that the storage photon exits the photon output end of the chalcogenide optical fiber link.

15. The quantum memory system of claim 1, further comprising a storage photon generator optically coupled to the photon receiving end of the chalcogenide optical fiber link.

16. The quantum memory system of claim 1, further comprising a cooling system thermally coupled to the chalcogenide optical fiber link.

17. The quantum memory system of claim 16, wherein the cooling system comprises a cooling chamber and the chalcogenide optical fiber link is positioned within the cooling chamber.

18. The quantum memory system of claim 16, wherein the cooling system comprises a laser cooling system and the chalcogenide optical fiber link is optically coupled to the laser cooling system.

* * * * *

UNITED STATES PATENT AND TRADEMARK OFFICE
CERTIFICATE OF CORRECTION

PATENT NO. : 9,659,651 B1
APPLICATION NO. : 15/203292
DATED : May 23, 2017
INVENTOR(S) : Bruce Gardiner Aitken et al.

It is certified that error appears in the above-identified patent and that said Letters Patent is hereby corrected as shown below:

On the Title Page

On the Page 2, in Column 2, item [56] under "Other Publications", Line 8, delete "Verlin" and insert -- Berlin --.

In the Claims

In Column 17, Line 17, in Claim 1, delete "of the of the" and insert -- of the --.

In Column 17, Line 21, in Claim 1, delete "of the of the" and insert -- of the --.

In Column 17, Line 63, in Claim 4, delete "of the of the" and insert -- of the --.

In Column 17, Line 67, in Claim 4, delete "of the of the" and insert -- of the --.

In Column 18, Line 31, in Claim 5, delete "of the of the" and insert -- of the --.

In Column 18, Line 35, in Claim 5, delete "of the of the" and insert -- of the --.

In Column 19, Line 3, in Claim 7, delete "of the of the" and insert -- of the --.

In Column 19, Line 7, in Claim 7, delete "of the of the" and insert -- of the --.

In Column 19, Line 37, in Claim 8, delete "of the of the" and insert -- of the --.

In Column 19, Line 41, in Claim 8, delete "of the of the" and insert -- of the --.

In Column 20, Line 4, in Claim 9, delete "of the of the" and insert -- of the --.

In Column 20, Line 8, in Claim 9, delete "of the of the" and insert -- of the --.

Signed and Sealed this
Seventh Day of January, 2025

Derrick Brent
*Acting Director of the United States Patent and Trademark Office*

CERTIFICATE OF CORRECTION (continued)
U.S. Pat. No. 9,659,651 B1

In Column 20, Line 39, in Claim 10, delete "of the of the" and insert -- of the --.

In Column 20, Line 43, in Claim 10, delete "of the of the" and insert -- of the --.

In Column 20, Line 56, in Claim 12, delete "alcnico" and insert -- alnico --.

In Column 21, Line 20, in Claim 14, delete "of the of the" and insert -- of the --.

In Column 21, Line 24, in Claim 14, delete "of the of the" and insert -- of the --.